United States Patent
Jeong et al.

(10) Patent No.: US 6,950,339 B2
(45) Date of Patent: Sep. 27, 2005

(54) CIRCUIT FOR GENERATING TRIM BIT SIGNAL IN A FLASH MEMORY DEVICE

(75) Inventors: Jong Bae Jeong, Ichon-Shi (KR); In Sun Park, Ichon-Shi (KR)

(73) Assignee: Hynix Semiconductor Inc., Ichon-Shi (KR)

( * ) Notice: Subject to any disclaimer, the term of this patent is extended or adjusted under 35 U.S.C. 154(b) by 0 days.

(21) Appl. No.: 10/462,717

(22) Filed: Jun. 17, 2003

(65) Prior Publication Data

US 2004/0004874 A1 Jan. 8, 2004

(30) Foreign Application Priority Data

Jul. 8, 2002 (KR) .................. 10-2002-0039370

(51) Int. Cl.⁷ .............................. G11C 16/06
(52) U.S. Cl. ..................... 365/185.17; 365/185.18; 365/202; 327/546

(58) Field of Search .............. 365/185.17, 185.18, 365/202; 327/546

(56) References Cited

U.S. PATENT DOCUMENTS

| | | | | |
|---|---|---|---|---|
| 4,245,165 A | * | 1/1981 | Hoffman | 327/546 |
| 5,243,239 A | * | 9/1993 | Khan et al. | 327/553 |
| 5,671,183 A | * | 9/1997 | Soenen et al. | 365/189.12 |
| 5,969,987 A | * | 10/1999 | Blyth et al. | 365/185.03 |

* cited by examiner

*Primary Examiner*—Richard Elms
*Assistant Examiner*—J. H. Hur
(74) *Attorney, Agent, or Firm*—Mayer, Brown, Rowe & Maw LLP

(57) ABSTRACT

A circuit for generating a trim bit signal in a flash memory device, comprises a control unit selected by a trim bit select signal and including a programmable and erasable cell, and an output unit for outputting a High level signal or a Low level signal through the trim bit signal output terminal depending on the program cell of the control unit.

12 Claims, 2 Drawing Sheets

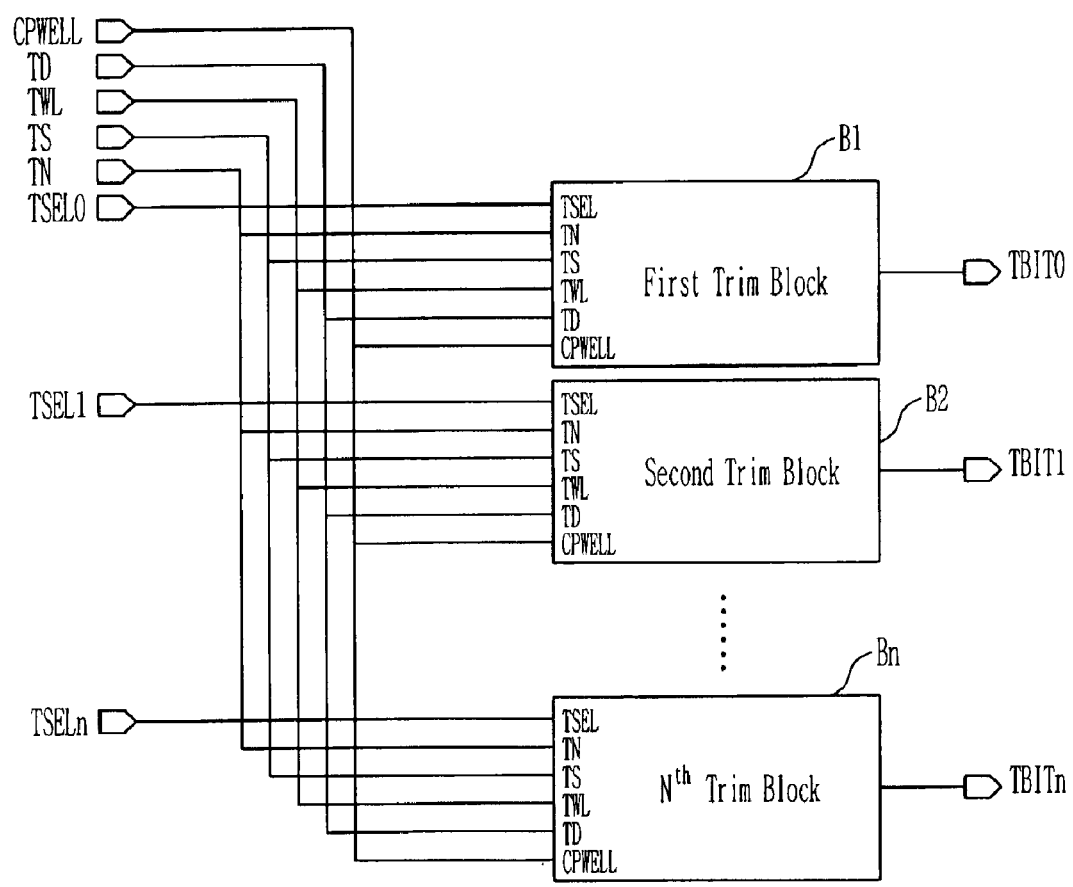

CIRCUIT FOR GENERATING TRIM BIT SIGNAL IN A FLASH MEMORY DEVICE

BACKGROUND OF THE INVENTION

1. Field of the Invention

The present invention relates to a circuit for generating a trim bit signal in NAND type flash memory devices, and more particularly, to a circuit for generating a trim bit signal capable of recovering the trim bit in a package status.

2. Background of the Related Art

In the NAND type flash memory device, the trim bit signal is generated in order to improve and change characteristics of the circuit within the chip.

FIG. 1 illustrates a conventional trim bit block. As shown in FIG. 1, a plurality of trim blocks B1, B2, . . . , Bn are provided. The first trim block B1 outputs a first trim bit signal TBIT1, the second trim block B2 outputs a second trim bit signal TBIT2 and the $N^{th}$ trim block Bn outputs a $N^{th}$ trim bit signal TBIT1. Characteristics of the circuit within the chip could be modified or improved by these trim bit signals.

FIG. 2 is a detailed circuit diagram of the trim block shown in FIG. 1. If a fuse FUSE is connected, the input of the inverter INV0 becomes a Low level due to a small current load of the PMOS transistor P0. Therefore, the output of the inverter INV1 becomes a High level, so that the trim bit signal TBIT becomes the High level.

On the contrary, if the fuse FUSE is disconnected, the input of the inverter INV0 becomes a High level. Accordingly, the output of the inverter INV1 becomes a Low level, so that the trim bit signal TBIT becomes the Low level.

In this conventional circuit for generating the trim bit signal, a work for the fuse is performed only in a wafer status. For this reason, the trim bit could not be recovered again after the work is performed. Therefore, there is a disadvantage that the value could not be changed depending on the status after packaging.

SUMMARY OF THE INVENTION

Accordingly, the present invention is contrived to substantially obviate one or more problems due to limitations and disadvantages of the related art, and an object of the present invention is to provide to a circuit for generating a trim bit signal that generates the trim bit using a cell.

According to the present invention, the trim bit could be recovered depending on circumstances even after the package.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a circuit for generating a trim bit signal in a flash memory device according to the present invention is characterized in that it comprises a control unit selected by a trim bit select signal and including a cell that is programmable and erasable, and an output unit for outputting a High level signal or a Low level signal through the trim bit signal output terminal depending on the program cell of the control unit.

The control unit comprises a first inverter for inverting the trim bit select signal, a first switching device connected between the output of the first inverter and a first node and turned on by a first control signal, the cell connected between the first node and a second node and driven by a second control signal, a second switching device connected between the second node and the output of the control unit and turned on by a third control signal, and a third switching device connected between the first node and the ground and turned on by a fourth control signal.

In another aspect of the present invention, it is to be understood that both the foregoing general description and the following detailed description of the present invention are exemplary and explanatory and are intended to provide further explanation of the invention as claimed.

BRIEF DESCRIPTION OF THE DRAWINGS

The above and other objects, features and advantages of the present invention will be apparent from the following detailed description of the preferred embodiments of the invention in conjunction with the accompanying drawings, in which:

FIG. 4 illustrates an example of the trim bit block to which the circuit for generating the trim bit of the present invention is applied.

DETAILED DESCRIPTION OF THE PREFERRED EMBODIMENT

Reference will now be made in detail to the preferred embodiments of the present invention, examples of which are illustrated in the accompanying drawings.

Figure 1:
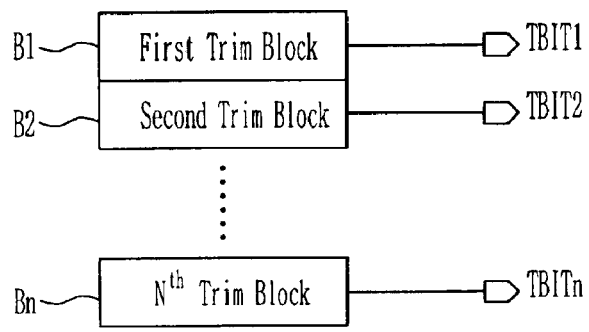
FIG. 1 illustrates a conventional trim bit block of a flash memory device.
Figure 2:
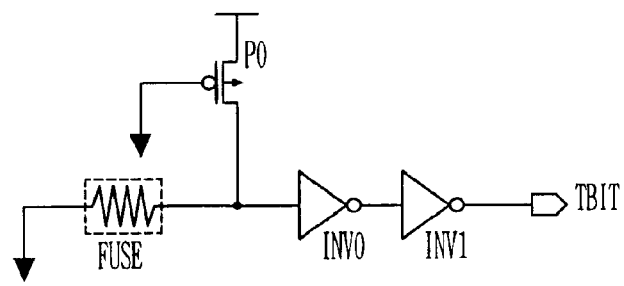
FIG. 2 is a detailed circuit diagram of the trim block shown in FIG. 1.
Figure 3:
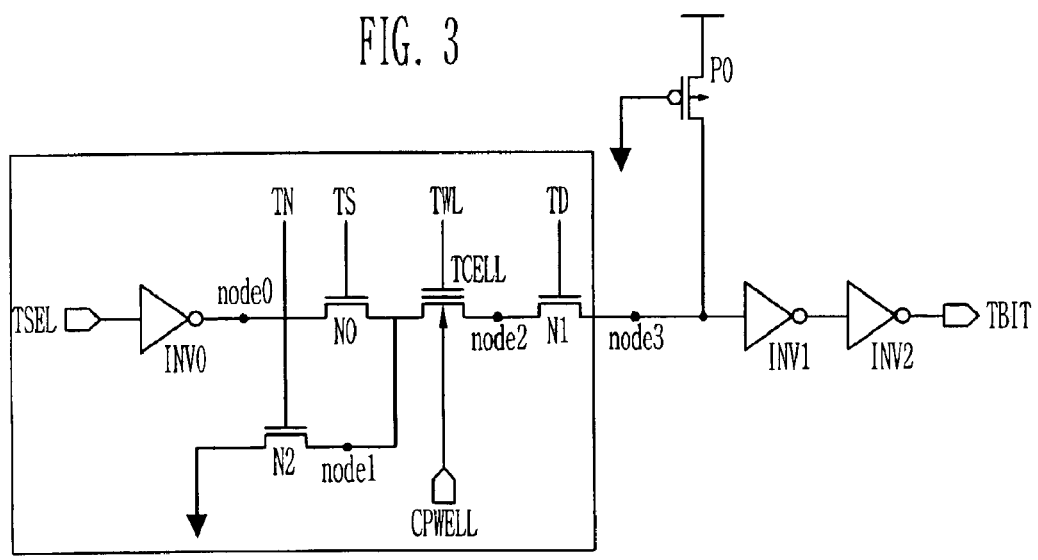
FIG. 3 illustrates a circuit for generating a trim bit signal in a flash memory device according to a preferred embodiment of the present invention.

FIG. 3 illustrates a circuit for generating a trim bit signal in a flash memory device according to a preferred embodiment of the present invention.

Referring to FIG. 3, the construction of the circuit for generating the trim bit signal will be first described.

An inverter INV0 for inverting a trim bit select signal TSEL is provided. A NMOS transistor N0 that is driven by a control signal TS is connected between the node node0 being the output of the inverter INV0 and the node node1. A cell TCELL that is driven by a control signal TWL is connected between the node node1 and the node node2. A NMOS transistor N1 that is driven by a control signal TD is connected between the node node2 and the node node3. A PMOS transistor P0 is connected between the node node3 and the power supply, the gate the PMOS transistor P0 is grounded. Inverters INV1 and INV2 are serially connected between the node node3 and the output TBIT. In addition, a NMOS transistor N2 that is controlled by a control signal TN is connected between the node node1 and the ground.

The operation of the circuit for generating the trim bit signal constructed above will be below described.

In a normal operation, if a power supply voltage (VCC) is applied to the control signal TWL, TD and TN, 0V is applied to the control signal TS and the cell TCELL is programmed, the node node3 becomes a High level since the cell TCELL is turned off. Therefore, the output TBIT becomes a High level.

If the cell TCELL is an erased cell, the potential of the node node3 becomes a Low level since the current flows into the NMOS transistor N2. Therefore, the output TBIT becomes the Low level.

In other words, the output TBIT is decided as in the case where the conventional fuse is used depending on the characteristic of the cell TCELL.

Meanwhile, the cell TCELL must be initially basically erased. If it is desired that the cell TCELL becomes an erase status, it is required that 0V is applied to the control signal TD, TS, TN and TWL, respectively, and an erase voltage (Vera) be applied to CPWELL of the cell TCELL. At this time, all the outputs TBIT have a Low level.

If it is desired that a specific bit becomes a High level, it is required that a corresponding trim bit signal TSEL be selected and the cell TCELL be programmed. This corresponds to the role to disconnect the fuse. If it is desired that the cell TCELL is programmed, it is required that the power supply voltage (VCC) is applied to the control signal TS, 0V is applied to the control signal TD and TN, a program voltage (Vpgm) is applied to the control signal TWL. In case that the cell is selected, as the node node0 becomes 0V and the channel of the cell becomes 0V, the cell is programmed. In case that the cell is not selected, the node node0 becomes a High level. Accordingly, as the node node1, the cell channel and the node node2 are self-boosted by the control signal TWL, the cell is not programmed. At this time, programming and erasing of the cell are performed based on the FN tunneling scheme. Furthermore, the bias condition depending on respective operations is well shown in Table 1.

TABLE 1

|  | TSEL | TN | TS | TWL | TD | CPWELL |
|---|---|---|---|---|---|---|
| Normal Operation | X | VCC | 0 V | VCC | VCC | 0 V |
| Trim Bit Program | H | 0 V | VCC | Vpgm | 0 V | 0 V |
| Trim Bit Erase | X | 0 V | 0 V | 0 V | 0 V | Vera |

FIG. 4 illustrates an example of the trim bit block to which the circuit for generating the trim bit of the present invention is applied.

FIG. 4 shows an example in which several trim bit blocks are actually used. In the trim bit block, CPWELL, TD, TWL, TS and TN are controlled at the same time. The trim bit blocks B1, B2 . . . BN are selected by the trim bit select signals TSEL0, TSEL1, . . . TSELn. Therefore, the trim bit signals TBIT0, TBIT1, . . . TBITn are outputted.

As described above, according to the present invention, important parameters could be controlled that decide the characteristics of the chip even after the package. Therefore, the present invention has advantageous effects that it can improve the characteristics of the chip and thus improve the productivity.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A circuit for generating a trim bit signal in a flash memory device, comprising:

a control unit selected by a trim bit select signal and a plurality of control signals, and including a cell that is programmable and erasable; and an output unit for outputting a High level signal or a Low level signal through a trim bit signal output terminal depending on a status of the cell of the control unit, wherein the control unit comprises:

a first inverter for inverting the trim bit select signal;

a first switching device connected between the output of the first inverter and a first node and turned on by a first control signal;

the cell connected between the first node and a second node and driven by a second control signal;

a second switching device connected between the second node and the output of the control unit and turned on by a third control signal; and a third switching device connected between the first node and the ground and turned on by a fourth control signal.

2. The circuit as claimed in claim 1, wherein the output unit comprises:

a PMOS transistor connected between a power supply and the output of the control unit, wherein a gate terminal of the PMOS transistor is grounded, and first and second inverters serially connected between the output of the control unit and the trim bit signal output terminal.

3. The circuit as claimed in claim 1, wherein each of the first, second and third switching devices consists of a transistor.

4. The circuit as claimed in claim 1, wherein an output signal of the output unit is decided depending on characteristics of the cell.

5. The circuit as claimed in claim 1, wherein important parameters deciding characteristics of the circuit are able to be controlled even after packaging.

6. The circuit as claimed in claim 1, wherein improved characteristics of the circuit improve productivity.

7. A circuit for generating a trim bit signal in a flash memory device, comprising:

a control unit selected by a trim bit select signal and including a cell that is programmable and erasable; and an output unit for outputting a High level signal or a Low level signal through a trim bit signal output terminal depending on a status of the cell of the control unit;

wherein the control unit comprises:

a first inverter for inverting the trim bit select signal;

a first switching device connected between the output of the first inverter and a first node and turned on by a first control signal;

the cell connected between the first node and a second node and driven by a second control signal;

a second switching device connected between the second node and the output of the control unit and turned on by a third control signal; and a third switching device connected between the first node and the ground and turned on by a fourth control signal.

8. The circuit as claimed in claim 7, wherein each of the first, second and third switching devices consists of a transistor.

9. The circuit as claimed in claim 7, wherein an output signal of the output unit is decided depending on characteristics of the cell.

10. The circuit as claimed in claim 7, wherein important parameters deciding characteristics of the circuit are able to be controlled even after packaging.

11. The circuit as claimed in claim 7, wherein improved characteristics of the circuit improve productivity.

12. The circuit as claimed in claim 7, wherein the output unit comprises:

a PMOS transistor connected between a power supply and the output of the control unit, wherein a gate terminal of the PMOS transistor is grounded, and first and second inverters serially connected between the output of the control unit and the trim bit signal output terminal.

* * * * *